US011327578B2

(12) United States Patent
Lin et al.

(10) Patent No.: US 11,327,578 B2
(45) Date of Patent: May 10, 2022

(54) CONTROL CIRCUIT

(71) Applicant: ASUSTEK COMPUTER INC., Taipei (TW)

(72) Inventors: Kuo-En Lin, Taipei (TW); Shau-Yang Hsieh, Taipei (TW); Ming-Hsing Chuang, Taipei (TW); Sheng-Yu Wang, Taipei (TW); Chih-Yuan Lin, Taipei (TW); Shih-Hung Chou, Taipei (TW); Xin-Han Cai, Taipei (TW); I-Ting Hsieh, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/354,688

(22) Filed: Jun. 22, 2021

(65) Prior Publication Data
US 2022/0004269 A1 Jan. 6, 2022

(30) Foreign Application Priority Data
Jul. 3, 2020 (TW) .................................. 109122504

(51) Int. Cl.
G06F 3/0354 (2013.01)
H01H 1/14 (2006.01)
G06F 3/038 (2013.01)

(52) U.S. Cl.
CPC ........ G06F 3/03543 (2013.01); G06F 3/0383 (2013.01); H01H 1/14 (2013.01); H01H 2227/036 (2013.01)

(58) Field of Classification Search
CPC ..... G06F 3/03543; G06F 3/0383; H01H 1/14; H01H 2227/036; H03K 17/941
See application file for complete search history.

(56) References Cited

U.S. PATENT DOCUMENTS

2021/0202193 A1\* 7/2021 Lee ...................... H03K 17/969

FOREIGN PATENT DOCUMENTS

| CN | 2800646 Y | 7/2006 |
| CN | 109426328 A | 3/2019 |

\* cited by examiner

*Primary Examiner* — Koosha Sharifi-Tafreshi
(74) *Attorney, Agent, or Firm* — Muncy, Geissler, Olds & Lowe, P.C.

(57) ABSTRACT

A control circuit for an input device including a micro-switch is provided. The control circuit includes an input circuit, a receiver circuit, a control unit, and a detecting unit. The input circuit includes a first contact and a second contact for electrically connecting to the micro-switch. The receiver circuit includes a third contact and a fourth contact for electrically connecting to the micro-switch. The control unit is electrically connected to the first contact and the third contact for providing an input signal via the first contact to the micro-switch and receiving a switching signal from the micro-switch via the third contact. The detecting unit detects a voltage of the second contact to generate a detecting signal. The control unit receives the detecting signal to determine a type of the micro-switch.

8 Claims, 3 Drawing Sheets

CONTROL CIRCUIT

CROSS-REFERENCE TO RELATED APPLICATION

This application claims the priority benefit of Taiwan application serial No. 109122504, filed on Jul. 3, 2020. The entirety of the above-mentioned patent application is hereby incorporated by reference herein and made a part of the specification.

BACKGROUND OF THE INVENTION

Field of the Invention

The disclosure relates to a control circuit and, more particularly, to a control circuit for an input device.

Description of the Related Art

Micro-switches for buttons of an input device include optical micro-switches and mechanical micro-switches, which have different structures. The reaction speed and the touch feelings are also different. The optical micro-switch has lower contacting wear and provide longer service life and higher response speed. The mechanical micro-switch includes a simple structure and provides a better user feedback.

The micro-switch for an input device (such as a mouse) usually has it's preset conditions. The control circuit configures to cooperate with the micro-switch. Due to the control circuit, users cannot replace the micro-switch according to their personal needs to increase the button life and adjust the button load feelings while clicking. Also, the switching signals generated by the two types of the micro-switches are not the same, Thus, if users replace the micro-switches without considering the corresponding control circuits, when the type of the control circuit or firmware is wrongly used, the operation of micro-switch cannot be determined correctly.

BRIEF SUMMARY OF THE INVENTION

A control circuit is adapted to an input device. The input device includes a micro-switch. The control circuit comprises: an input circuit including a first contact and a second contact that electrically connected to the micro-switch; a receiver circuit including a third contact and a fourth contact that electrically connected to the micro-switch; a control unit electrically connected to the first contact and the third contact, configured to output an input signal to the micro-switch via the first contact and receive a switching signal from the micro-switch via the third contact; and a detecting unit configured to detect a voltage of the second contact to generate a detecting signal, and the control unit receiving the detecting signal to determine a type of the micro-switch.

Via a control unit in embodiments, when the type of the micro-switch in the input device (such as the mouse 10) is determined, a proper control mode is selected according to the type of the micro-switch. The operation of the micro-switch would not be determined wrongly.

DETAILED DESCRIPTION OF THE EMBODIMENTS

Figure 1:
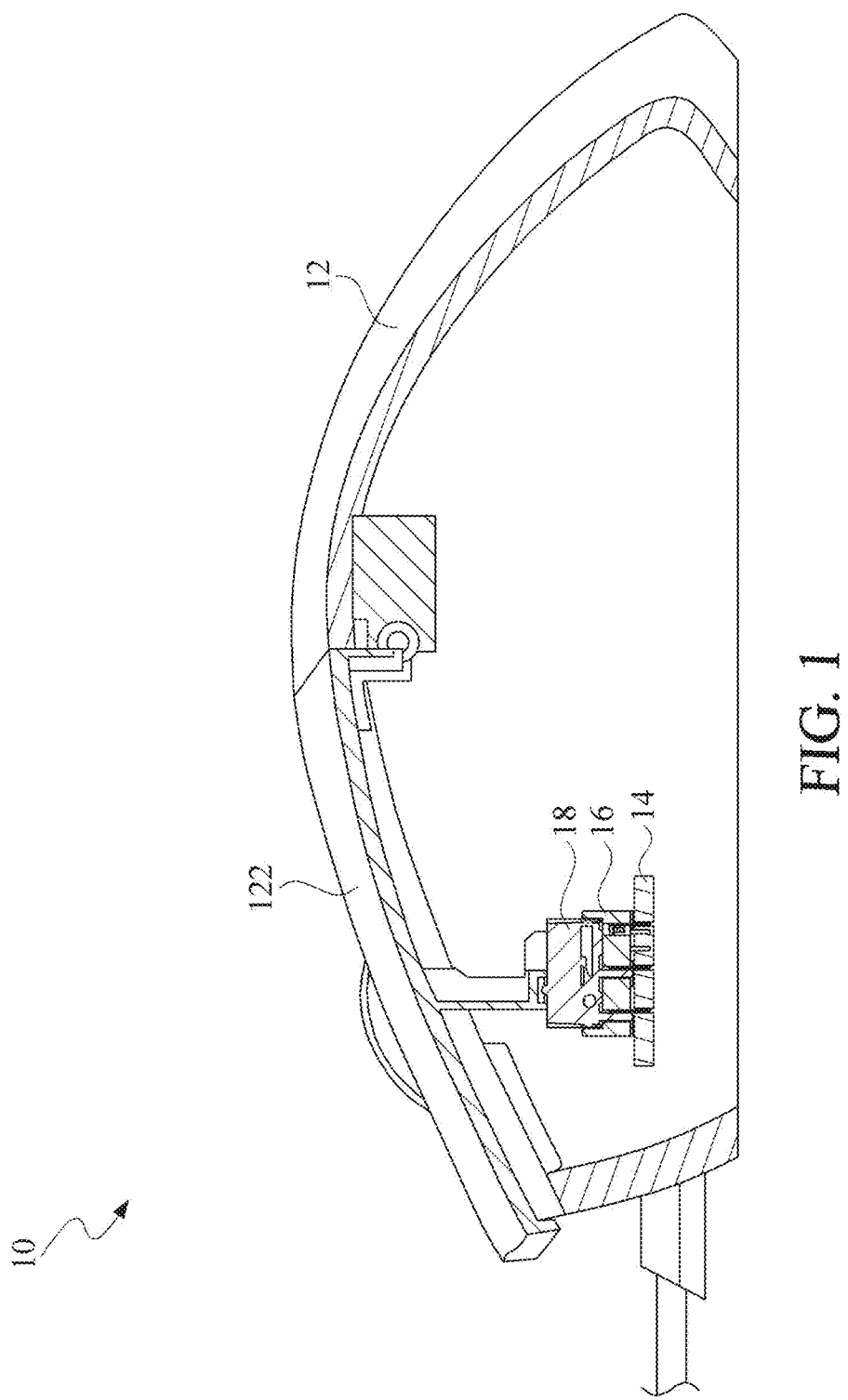
FIG. 1 is a cross section of a mouse that a control circuit is adapted to according to an embodiment.

FIG. 1 is a cross section of a mouse that a control circuit is adapted according to an embodiment, which is not limited herein. The control circuit in embodiments are also adapted to the input devices of other types, such as keyboards. A mouse 10 includes a casing 12, a circuit board 14, a micro-switch base 16, and a micro-switch 18. The casing 12 includes a button 122.

The circuit board 14 is disposed in the casing 12. The control circuit (not shown) is disposed on the circuit board 14. The micro-switch base 16 is disposed on the circuit board 14. In the embodiment, the micro-switch 18 is an optical micro-switch or a mechanical micro-switch. The micro-switch 18 is detachably disposed at the micro-switch base 16. A signal output pin under the micro-switch 18 is electrically connected to the control circuit on the circuit board 14 via the micro-switch base 16.

Figure 2:
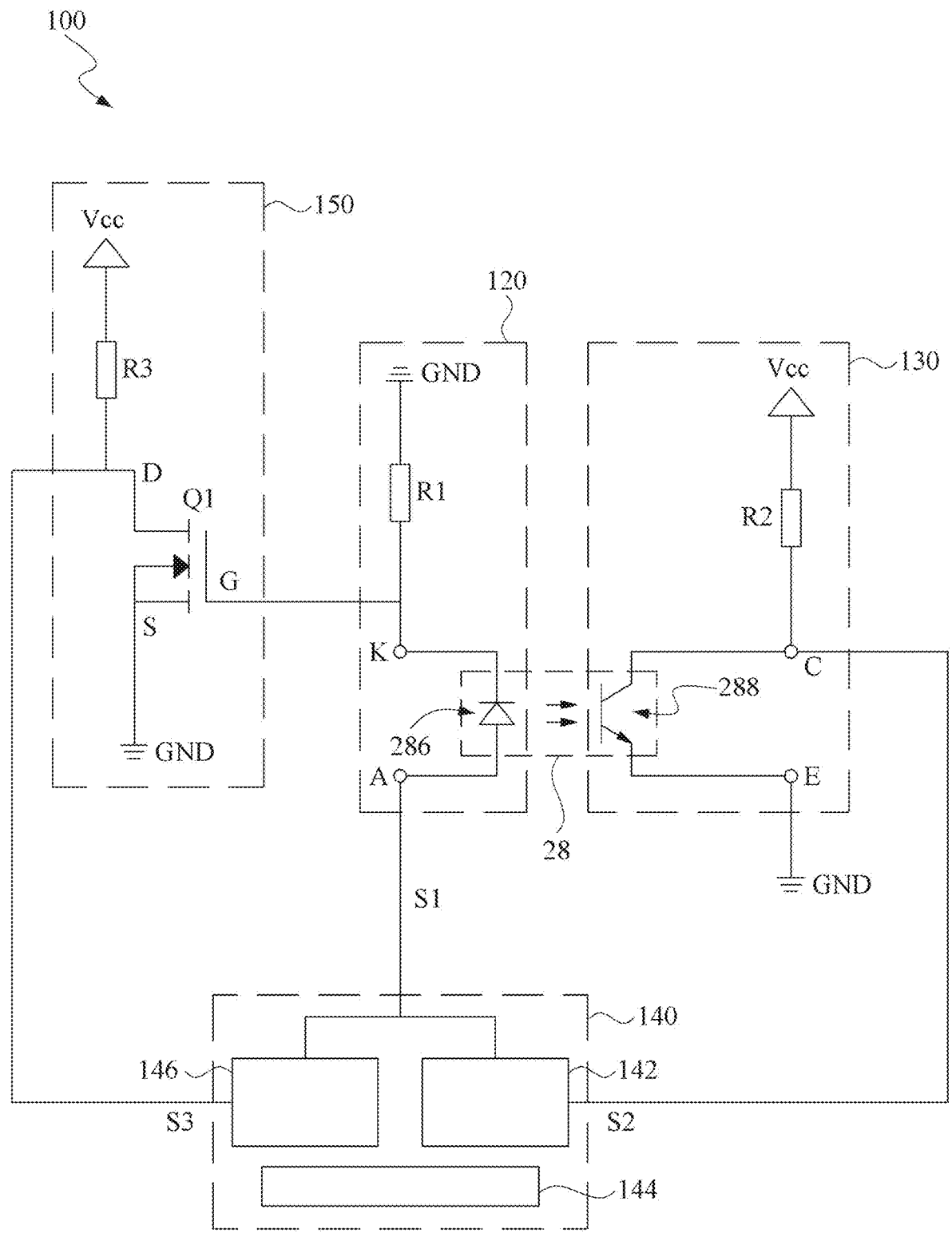
FIG. 2 is a schematic diagram showing a circuit of a control circuit according to an embodiment.

FIG. 2 is a schematic diagram showing a circuit of a control circuit according to an embodiment. A control circuit 100 is adapted to the mouse in FIG. 1 to determine the type of the micro-switch 18. Then, a proper mode is selected to control the operation of the micro-switch 18.

As shown in FIG. 2, the control circuit 100 includes an input circuit 120, an receiver circuit 130, a control unit 140, and a detecting unit 150. An optical micro-switch 28 is shown. The optical micro-switch 28 includes a LED 286 and an optical-electrical converter 288.

The input circuit 120 includes a first contact A and a second contact K. The first contact A and the second contact K are electrically connected to the LED 286 of the optical micro-switch 28. The receiver circuit 130 includes a third contact C and a fourth contact E. The third contact C and the fourth contact E are electrically connected to the optical-electrical converter 288 of the optical micro-switch 28.

In an embodiment, as shown in FIG. 2, the input circuit 120 includes a first resistor R1. A terminal of the first resistor R1 is electrically connected to the second contact K. The other terminal of the first resistor R1 is electrically connected to a low voltage terminal. In an embodiment, the low voltage terminal is a GND terminal.

In an embodiment, as shown in FIG. 2, the receiver circuit 130 includes a second resistor R2. A terminal of the second resistor R2 is electrically connected to the third contact C, and the other terminal of the second resistor R2 is electrically connected to a high voltage terminal.

In an embodiment, the high voltage terminal is a voltage supply terminal Vcc. In an embodiment, the fourth contact E is electrically connected to a low voltage terminal. In an embodiment, the low voltage terminal is a GND terminal.

In the optical micro-switch 28, the optical-electrical converter 288 receives light of the LED 286 and converts the light of the LED 286 to an electric signal. Then, the electric signal is output. The optical micro-switch 28 selectively shields the optical path of the LED 286 and the optical-electrical converter 288 to control the output signal.

The control unit 140 is electrically connected to the first contact A and the third contact C. An input signal S1 is output to the LED 286 of the optical micro-switch 28 via the first contact A to conduct the LED 286. The control unit 140 receives the switching signal S2 at the third contact C via the optical-electrical converter 288 of the optical micro-switch 28. In an embodiment, the control unit 140 is a microcontroller unit (MCU).

The detecting unit 150 detects the voltage of the second contact K to generate a detecting signal S. The control unit 140 is electrically connected to the detecting unit 150 to receive the detecting signal S3 to determine whether the micro-switch in the mouse is the optical micro-switch. Then, the type of the micro-switch is determined.

In an embodiment, as shown in FIG. 2, the control unit 140 includes an optical micro-switch control module 142, a mechanical micro-switch control module 144, and a micro-switch determine module 146. The optical micro-switch control module 142 is configured to generate the input signal S1 and receive the switching signal S2.

The micro-switch determine module 146 receives the input signal S1 and the detecting signal S3 from the optical micro-switch control module 142 to determine whether the micro-switch in the mouse is the optical micro-switch. The mechanical micro-switch control module 144 is configured to control the mechanical micro-switch.

The control unit 140 selects the optical micro-switch control module 142 or the mechanical micro-switch control module 144 to control to the determine result of the micro-switch determine module 146. In an embodiment, the optical micro-switch control module 142, the mechanical micro-switch control module 144, and the micro-switch determine module 146 are achieved via firmwares.

In an embodiment, as shown in FIG. 2, the detecting unit 150 includes a transistor Q1 and a third resistor R3. A gate electrode G of the transistor Q1 is electrically connected to the second contact K. A source electrode S of the transistor Q1 is electrically connected to a low voltage terminal.

In an embodiment, the low voltage terminal is a GND terminal. A drain electrode D of the transistor Q1 is electrically connected to a high voltage terminal via the third resistor R3. In an embodiment, the high voltage terminal is the voltage supply terminal Vcc. The control unit 140 detects the voltage of the second contact K via the detection of the voltage of the drain electrode D of the transistor Q1.

As shown in FIG. 2, in the embodiment where the micro-switch mouse is equipped with the optical micro-switch 28, when the control unit 140 outputs the input signal S1 of the high voltage, the first contact A is at the high voltage. The LED 286 of the optical micro-switch 28 is conducted, and the voltage of the second contact K is increased. Since the voltage of the gate electrode G of the transistor Q1 is high, the transistor Q1 is conducted. Then, the voltage of the drain electrode D of the transistor Q1 is reduced. The detecting signal S3 of the low voltage is output to the control unit 140.

When the control unit 140 outputs the input signal S1 of the low voltage, the first contact A has the low voltage. The LED 286 of the optical micro-switch 28 is not conducted. The second contact K has the low voltage. The transistor Q1 is at an off state. The drain electrode D of the transistor Q1 keeps at the high voltage to generate the detecting signal S3 of the high voltage to output to the control unit 140.

When the micro-switch is not disposed in the mouse or the micro-switch is the mechanical micro-switch, whether the input signal S1 generated from the control unit 140 has the high voltage or the low voltage, the first contact A and the second contact K are not conducted. The second contact K keeps at the low voltage. The transistor Q1 is at the off state. The drain electrode D of the transistor Q1 keeps at the high voltage to generate the detecting signal S3 of the high voltage to the control unit 140.

The control unit 140 determines the type of the micro-switch in the mouse according to the voltage of the input signal S1 and the received detecting signal S3. Then, a proper control mode is selected to avoid a misoperation.

Figure 3:
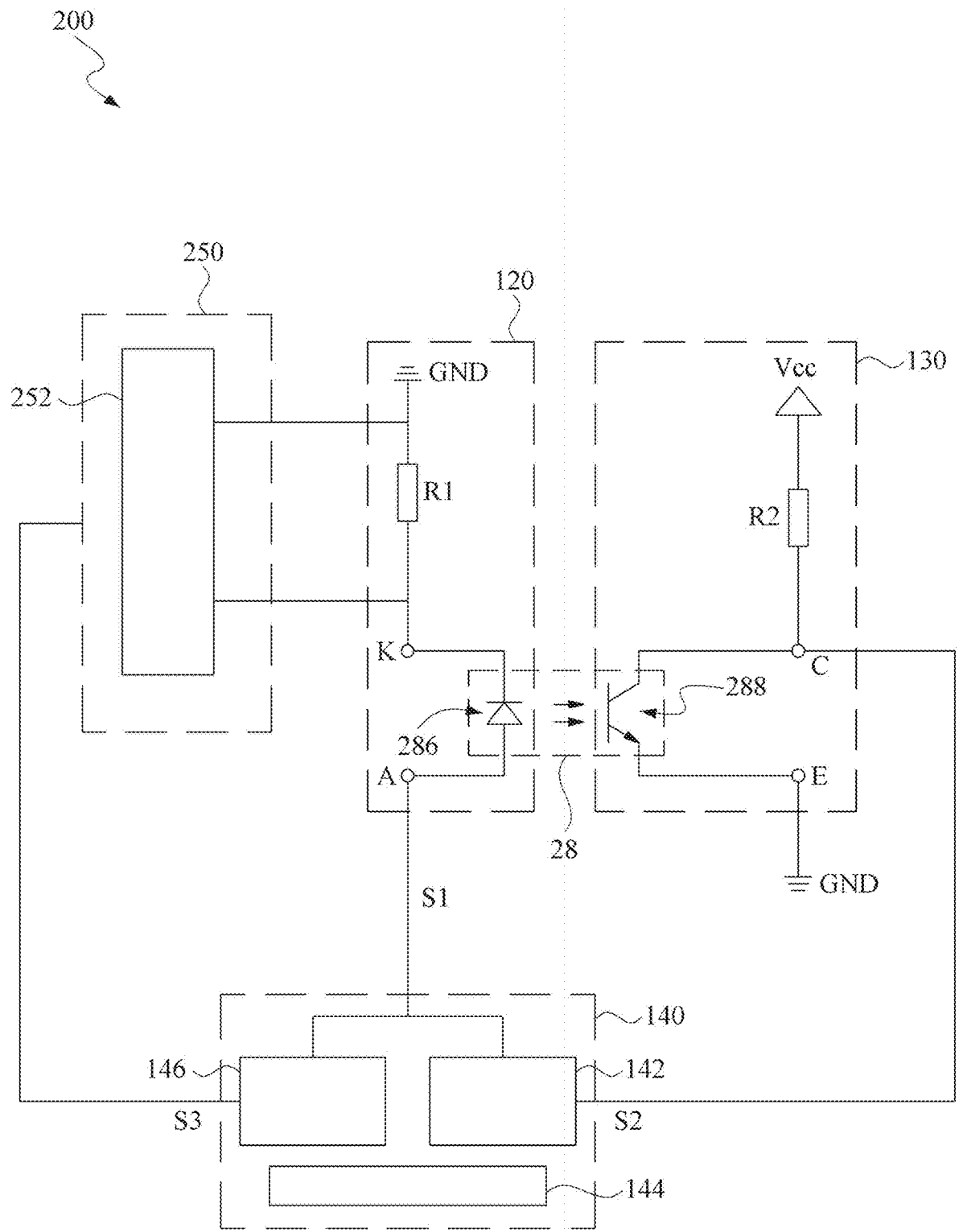
FIG. 3 is a schematic diagram showing a circuit of a control circuit according to an embodiment.

FIG. 3 is a schematic diagram showing a circuit of a control circuit according to an embodiment. The difference between the control circuit 200 in the embodiment and the control circuit 100 in FIG. 2 is the difference of the detecting units 150 and 250.

As shown in FIG. 2, the detecting unit 250 includes a current detecting circuit 252. The current detecting circuit 252 is electrically connected to the high voltage terminal and the low voltage terminal of the first resistor R1 to detect the current through the first resistor R1. Then, the voltage of the second contact K is determined.

As shown in FIG. 2, when the micro-switch in the mouse is the optical micro-switch 28, when the control unit 140 outputs the input signal S1 of the high voltage, the first contact A has the high voltage. The LED 286 of the optical micro-switch 28 is conducted. The voltage of the second contact K is high. The current through the first resistor R1 is increased.

When the control unit 140 outputs the input signal S1 of the low voltage, the first contact A has the low voltage. The LED 286 of the optical micro-switch 28 is not conducted. The second contact K has the low voltage. At the same time, the current through the first resistor R1 is near zero.

When the micro-switch is not disposed in the mouse or the micro-switch is the mechanical micro-switch, no matter the input signal S1 of the control unit 140 has the high voltage or the low voltage, the first contact A and the second contact K are not conducted. The second contact K keeps at the low voltage. The current through the first resistor R1 is near zero.

In sum, a control unit determines a type of a micro-switch in an input device (such as a mouse) according to the voltage of an input signal and a current value through a first resistor. Then, a proper control mode is selected. The operation of the micro-switch would not be determined wrongly due to a selected wrong control mode.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A control circuit, adapted to an input device, the input device including a micro-switch, the control circuit comprising:
    an input circuit including a first contact and a second contact electrically connected to the micro-switch;
    a receiver circuit including a third contact and a fourth contact electrically connected to the micro-switch;
    a control unit electrically connected to the first contact and the third contact, configured to output an input signal to the micro-switch via the first contact and receive a switching signal from the micro-switch via the third contact; and
    a detecting unit configured to detect a voltage of the second contact to generate a detecting signal, and the control unit receiving the detecting signal to determine a type of the micro-switch.

2. The control circuit according to claim 1, wherein the input circuit further includes a first resistor, one terminal of the first resistor is electrically connected to the second contact, the other terminal of the first resistor is electrically connected to a low voltage terminal.

3. The control circuit according to claim 1, wherein the receiver circuit further includes a second resistor, one terminal of the second resistor is electrically connected to the third contact, the other terminal of the second resistor is electrically connected to a high voltage terminal.

4. The control circuit according to claim 1, wherein the fourth contact is electrically connected to a low voltage terminal.

5. The control circuit according to claim 1, wherein the detecting unit includes a transistor and a third resistor, a gate electrode of the transistor is electrically connected to the second contact, a source electrode of the transistor is electrically connected to a low voltage terminal, a drain electrode of the transistor is electrically connected to a high voltage terminal via the third resistor, and the control unit detects the voltage of the second contact via a voltage of the drain electrode.

6. The control circuit according to claim 2, wherein the detecting unit includes a current detecting circuit, the current detecting circuit is electrically connected to the first resistor to detect a current through the first resistor.

7. The control circuit according to claim 1, wherein the control unit includes:
 an optical micro-switch control module configured to generate the input signal and receive the switching signal;
 a micro-switch determine module configured to receive the input signal and the detecting signal to determine the type of the micro-switch; and
 a mechanical micro-switch control module configured to control the micro-switch when the micro-switch determine module determines that the micro-switch is not the optical micro-switch.

8. The control circuit according to claim 7, wherein the micro-switch determine module has a firmware structure.

\* \* \* \* \*